United States Patent [19]

Punzenberger

[11] Patent Number: 5,703,477

[45] Date of Patent: Dec. 30, 1997

[54] CURRENT DRIVER CIRCUIT WITH TRANSVERSE CURRENT REGULATION

[75] Inventor: Manfred Punzenberger, Gallneukirchen, Austria

[73] Assignee: Siemens Aktiengesellschaft, Munich, Germany

[21] Appl. No.: 713,248

[22] Filed: Sep. 12, 1996

[30] Foreign Application Priority Data

Sep. 12, 1995 [DE] Germany .................. 195 33 768.9

[51] Int. Cl.$^6$ .................................................. G05F 3/16
[52] U.S. Cl. .................................... 323/313; 323/316
[58] Field of Search ............................ 323/313, 314, 323/315, 316

[56] References Cited

U.S. PATENT DOCUMENTS

| | | | |
|---|---|---|---|
| 3,629,691 | 12/1971 | Wheatley | 323/315 |
| 4,491,780 | 1/1985 | Neidorff | 323/313 |
| 4,663,584 | 5/1987 | Okada et al. | 323/315 |
| 4,670,706 | 6/1987 | Tobita | 323/313 |
| 4,812,735 | 3/1989 | Sawada et al. | 323/313 |
| 5,008,609 | 4/1991 | Fukiage | 323/313 |
| 5,266,887 | 11/1993 | Smith | 323/316 |
| 5,302,888 | 4/1994 | Hellums et al. | 323/314 |
| 5,412,309 | 5/1995 | Ueunten | 323/316 |
| 5,491,437 | 2/1996 | Rincon et al. | 323/316 |
| 5,594,326 | 1/1997 | Gilbert | 323/313 |
| 5,594,382 | 1/1997 | Kato et al. | 323/315 |

FOREIGN PATENT DOCUMENTS 36 06 203   7/1992   Germany .................. G05F 3/16

OTHER PUBLICATIONS

Patents Abstracts of Japan, P-1279, Nov. 22, 1991, vol. 15, No. 462 & JP-A-3-196318 (NEC Corp.) Aug. 27, 1991.
An article entitled: "A Highly Linear CMOS Buffer Amplifier", by J. A. Fisher and R. Koch, n IEEE Journal of Solid State Circuits, vol. SC-22, No. 3, Jun. 1987, pp. 330-334.

*Primary Examiner*—Jeffrey L. Sterrett
*Attorney, Agent, or Firm*—Herbert L. Lerner; Laurence A. Greenberg

[57] ABSTRACT

A current driver circuit with transverse current regulation includes a CMOS output driver stage. Each output transistor is assigned one gate-coupled and source-coupled current polling transistor. Control signals are derived from currents flowing through the current polling transistors, and a first branch of a differential amplifier is triggered by these signals. A second branch thereof is controlled by a reference signal. Input branches of current mirrors are each connected into an output circuit of the differential amplifier, and output branches of the current mirrors include gate-coupled and source-coupled transistors for the connection of an input signal. Center pickups of the output branches of these current mirrors each serve to trigger one of the output transistors. The current driver circuit has a high output voltage rise and output transistors with little surface area, and could be operated with a low supply voltage.

6 Claims, 2 Drawing Sheets

CURRENT DRIVER CIRCUIT WITH TRANSVERSE CURRENT REGULATION

BACKGROUND OF THE INVENTION

FIELD OF THE INVENTION

The invention relates to a current driver circuit with transverse current regulation, including at least two complementary output transistors connected in series between terminals for a supply voltage, and an output terminal connected to a node interconnecting the output transistors.

A CMOS output driver is described in an article entitled: "A Highly Linear CMOS Buffer Amplifier", by J. A. Fisher and R. Koch, in IEEE Journal of Solid State Circuits, Vol. SC-22, No. 3, June 1987, pp. 330–334. Since both output transistors in that device are connected to be conducting simultaneously, regulation of the transverse current is necessary. To that end, the output transistors are triggered through current mirrors. Adjusting the transverse current is possible, as long as both output transistors are operated at saturation. However, the circuit has the disadvantage of only permitting a slight voltage rise at the gate terminals of the output transistors. Relatively large output transistors are therefore necessary for high current driver capability. Moreover, a relatively high supply voltage (of 5 V, for instance) is needed.

SUMMARY OF THE INVENTION

It is accordingly an object of the invention to provide a current driver circuit with transverse current regulation, which overcomes the hereinafore-mentioned disadvantages of the heretofore-known devices of this general type, which enables a high output voltage rise, which requires only relatively small output transistors and which can be operated at low supply voltage.

With the foregoing and other objects in view there is provided, in accordance with the invention, a current driver circuit with transverse current regulation, comprising supply voltage terminals; at least two complementary output transistors having gate and source terminals and having main current paths, the main current paths being interconnected at a connecting node and being connected in series between the supply voltage terminals; an output terminal connected to the connecting node; current polling transistors each having a gate terminal connected to the gate terminal of a respective one of the output transistors and each having a source terminal connected to the source terminal of a respective one of the output transistors; a differential amplifier having one branch controlled by signals derived from the current polling transistors and another branch controlled by a reference signal; first and second current paths each having one input transistor with coupled gate terminals and each having a center pickup controlling a respective one of the output transistors; and current mirrors each coupling one of the branches of the differential amplifier into a respective one of the current paths.

In accordance with another feature of the invention, one of the branches of the differential amplifier has a first and a second transistor with main current paths connected in parallel and gate terminals each being controlled by one of the signals derived from the current polling transistors; and the other of the branches has a third and a fourth transistor with main current paths connected in parallel, source terminals coupled the first and second transistors and gate terminals controlled by a reference signal.

In accordance with a further feature of the invention, there is provided a first resistor connected in series with one of the current polling transistors; a second resistor; a current mirror having an output branch into which the second resistor is connected, and an input branch connected in series with the other of the current polling transistors; the derived signal for controlling the one branch of the differential amplifier being picked up at the resistor.

In accordance with an added feature of the invention, there is provided another current path being connected between the supply voltage terminals, the other current path having a series circuit of a resistor and a reference current source with a node coupling therebetween at which the reference signal is picked up.

In accordance with an additional feature of the invention, the resistors are diode-coupled MOS transistors.

In accordance with a concomitant feature of the invention, the current mirrors are first and second current mirrors; the first current mirror has an output branch with a transistor connected in the first current path in series with the input transistor, and an input branch connected in series with the first and second transistors of the differential amplifier; the second current mirror has an output branch with a transistor connected in the second current path in series with the input transistor, and an input branch connected in series with the third and fourth transistors of the differential amplifier; and the input transistor and the transistor of the output branch in the first current path have a coupling node therebetween connected to the gate of one of the output transistors, and the input transistor and the transistor of the output branch in the second current path have a coupling node therebetween connected to the gate of the other of the output transistors.

In the circuit of the invention, the transverse current regulation is provided relatively accurately. The use of small output transistors economizes on chip surface area, in the embodiment as an integrated circuit. Relatively high gate-to-source voltages at the output transistors are possible. Due to the high voltage rise attainable at the output, the output transistors can operate with high gain in the resistor region. High ohmic and capacitive loads can be employed. The output rise extends to near the supply voltage, so that for a given load current, high controllability exists. In all, the requisite supply voltage is relatively low, and in practical embodiments is below 2 V.

Other features which are considered as characteristic for the invention are set forth in the appended claims.

Although the invention is illustrated and described herein as embodied in a current driver circuit with transverse current regulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
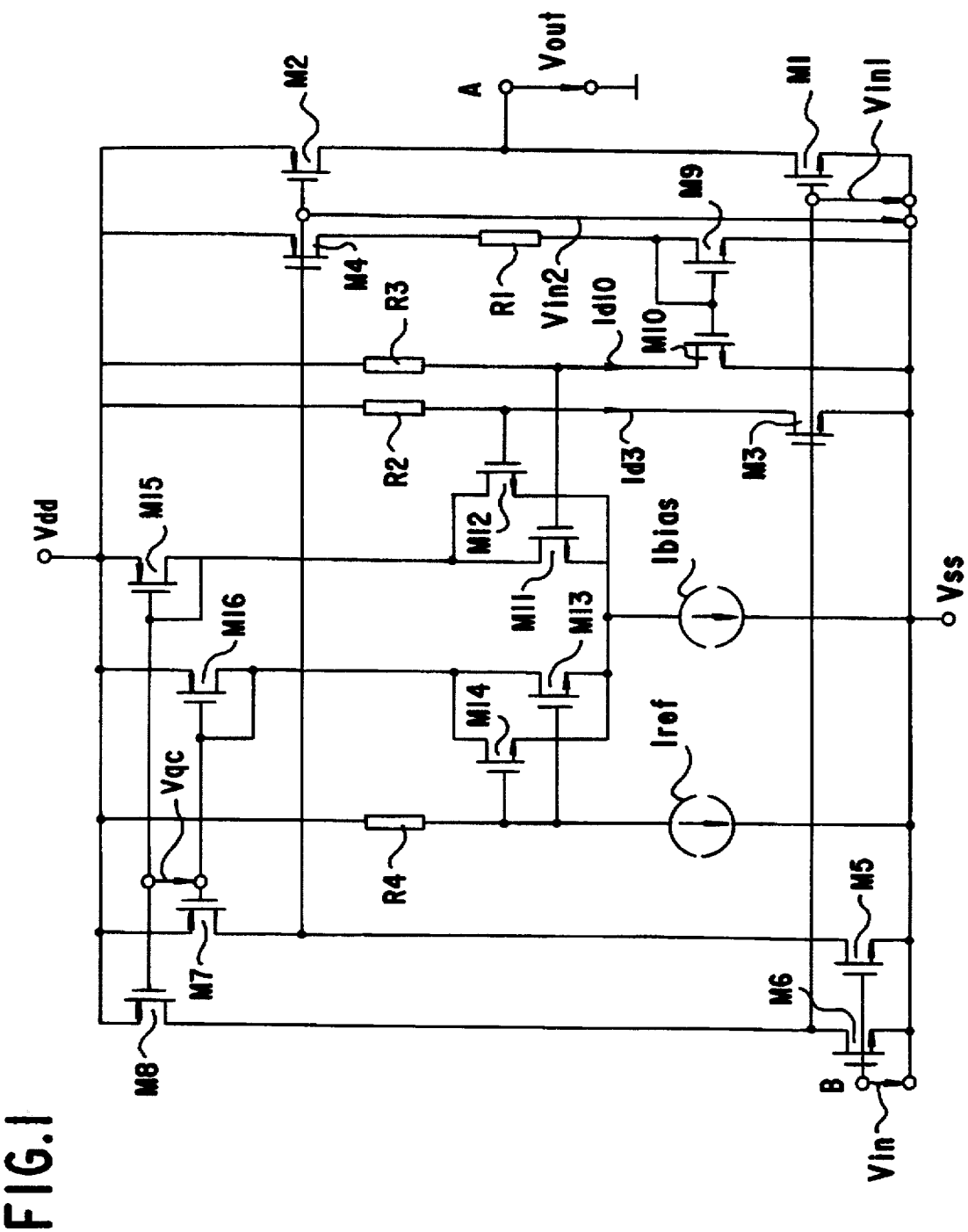
FIG. 1 is a schematic circuit diagram of an embodiment of the invention.

Referring now in detail to the single figure of the drawing, there is seen an output stage which may, for instance, be used as an output stage of a CMOS operational amplifier. The output stage includes two complementary MOS transistors M1, M2. A source terminal of the n-channel MOS transistor M1 is connected to one terminal for a supply potential Vss (such as ground). A source terminal of the p-channel MOS transistor M2 is connected to one terminal for a (positive) supply potential Vdd. Drain terminals of the transistors M1, M2 are connected to an output terminal A, at which an output voltage Vout to ground is applied.

In principle, the output voltage Vout is adjusted through a common-mode component Vin1+Vin2 of the voltage applied to gate terminals of the transistors M1, M2. A transverse current is defined by a differential component Vin2−Vin1 of the gate voltages of the transistors M1, M2.

Each of the transistors M1, M2 is assigned a respective current polling transistor M3 and M4 for detecting currents flowing through each of the transistors M1, M2. The transistor M3 has a source terminal connected to the terminal for the supply potential Vss and a gate terminal connected to the gate terminal of the transistor M1. Similarly, the complementary transistor M4 has a source terminal connected to the terminal for the supply potential Vdd and a gate terminal connected to the gate terminal of the transistor M2. A current flowing through the transistor M4 is suitably diverted through a current mirror M9, M10 to the terminal for the supply potential Vss. Drain currents Id3, Id10 through the transistors M3 and M10, which are respectively coupled to the currents through the transistors M1, M2, are thereby oriented in the same direction, which makes the evaluation easier. A resistor R1 in the input branch of the current mirror M9, M10 provides for current limitation. One respective resistor R2, R3 is connected into the drain current circuit of each of the transistors M3, M10, and as a result the respective currents Id3 and Id10 are converted into corresponding voltages referred to the supply potential Vdd.

When a load is connected to the output terminal A, a current is drawn from or fed into the terminal A. Whichever output transistor M1 or M2 has the lesser current flowing through it is then in saturation. Since the respectively assigned current polling transistor M3 and M4 has the same gate-to-source voltage as the respective transistor M1 or M2, the associated drain currents of the transistors M1 and M3, or of the transistors M2 and M4, are in a fixed ratio to one another, as determined by the transistor geometry. The current flowing through whichever output transistor M1, M2 is in saturation then represents the transverse current through the current path formed of the output transistors M1, M2. These currents become a measure for the transverse current through the output transistors M1, M2, through the use of the direct coupling of this current with the currents Id3 or Id10. In the same way, the voltages dropping at the resistors R2, R3 are a measure for the transverse current.

The voltages applied to the resistors R2, R3 are fed into a differential amplifier configuration. To that end, a coupling node between the resistor R2 and the transistor M3 is connected to a gate terminal of an MOS transistor M12. A coupling node between the resistor R3 and the transistor M10 is connected to a gate terminal of an MOS transistor M11. The MOS transistors M11, M12 of one branch are connected parallel with regard to their drain-to-source paths. Another branch of the differential amplifier configuration includes MOS transistors M13, M14, which are connected parallel with regard to their drain-to-source paths and have gate terminals that are controlled by a reference potential. Source terminals of the transistors M11 to M14 are coupled together and are connected, through a current source Ibias, to the terminal for the supply potential Vss. A reference voltage signal is derived from a resistor R4 having a first terminal which is connected to the terminal for the supply potential Vdd and a second terminal that is connected, through a reference current source Iref, to the terminal for the supply potential Vss.

A current mirror circuit has input branches each being connected into coupled drain circuits of the transistors M11, M12 and M13, M14 of the two branches of the differential amplifier configuration. A reference node of the current mirror circuit is the terminal for the supply potential vdd. To that end, drain terminals of the transistors M11, M12 are connected through a drain-to-source path of an MOS transistor M15 to the terminal for the supply potential Vdd and gate and drain electrodes of the transistor M15 are connected to one another. Correspondingly, a transistor M16 connects drain terminals of the transistors M13, M14 to the supply potential vdd. Controlled transistors M8 and M7 are each located in an output branch of a respective one of these current mirrors, and gate terminals of the transistors M8, M15 are connected to gate terminals of the transistors M7, M16. Drain terminals of the transistors M7, M8 are each connected through a drain-to-source path of a respective transistor M5 and M6 to the terminal for the ground potential Vss. Gate electrodes of the transistors M5, M6 are coupled together to a terminal B for an input signal Vin. A coupling node of the drain terminals of the transistors M6, M8 serves to trigger the gate terminal of the transistor M1, and a coupling node of the drain terminals of the transistors M5, M7 serves to trigger the gate terminal of the transistor M2. The output voltage Vout is adjusted by the input voltage Vin at the input transistors M5, M6, and the transverse current through the output transistors M1, M2 is adjusted through the use of a voltage difference Vqc between the gate terminals of the transistors M8 and M7.

If the output driver is driven without a load current at the terminal A, then a resting current flows through the output transistors M1, M2. The currents Id3 and Id10 are equal in magnitude, so that the transistors M11, M12 (on the condition of equal resistors R2, R3) are triggered by the same potential. The currents flowing through the two branches of the differential amplifier are reflected through the respective transistors M15 and M16 into the input current paths having the respective transistors M7 and M8, through which the gate terminals of the transistors M2 and M1 are triggered in turn, so that the transverse current is regulated through the use of the voltage Vqc.

If one of the two output transistors M1 or M2 additionally carries a load current, then the other of the output transistors M2 or M1 enters saturation. As described above, the associated current Id10 or Id3 is a measure for the respective transverse current. The lesser of the currents, Id10 or Id3, produces the lesser voltage drop at the corresponding resistor R3 or R2, so that the transistors M1 or M12 triggered by this resistance remains conducting, while the other of these transistors is blocked. As a consequence, twice the current flows through whichever transistor M11, M12 is the conducting transistor. As a result, its gate-to-source voltage is slightly greater than if there were no load current at the output. As an additional result, and because of the source coupling to the transistors M11, M12, the gate-to-source voltage of the reference transistors M13, M14 is increased by this amount, so that the voltage Vqc across the transistor M16 is increased. This in turn means that the transverse current through the output transistor, M2 or M1 that is in saturation, is adjusted to be slightly higher. In the practical embodiment, the result is a transverse current that is higher by approximately 5 to 10% than if the output A is not loaded.

Figure 2:
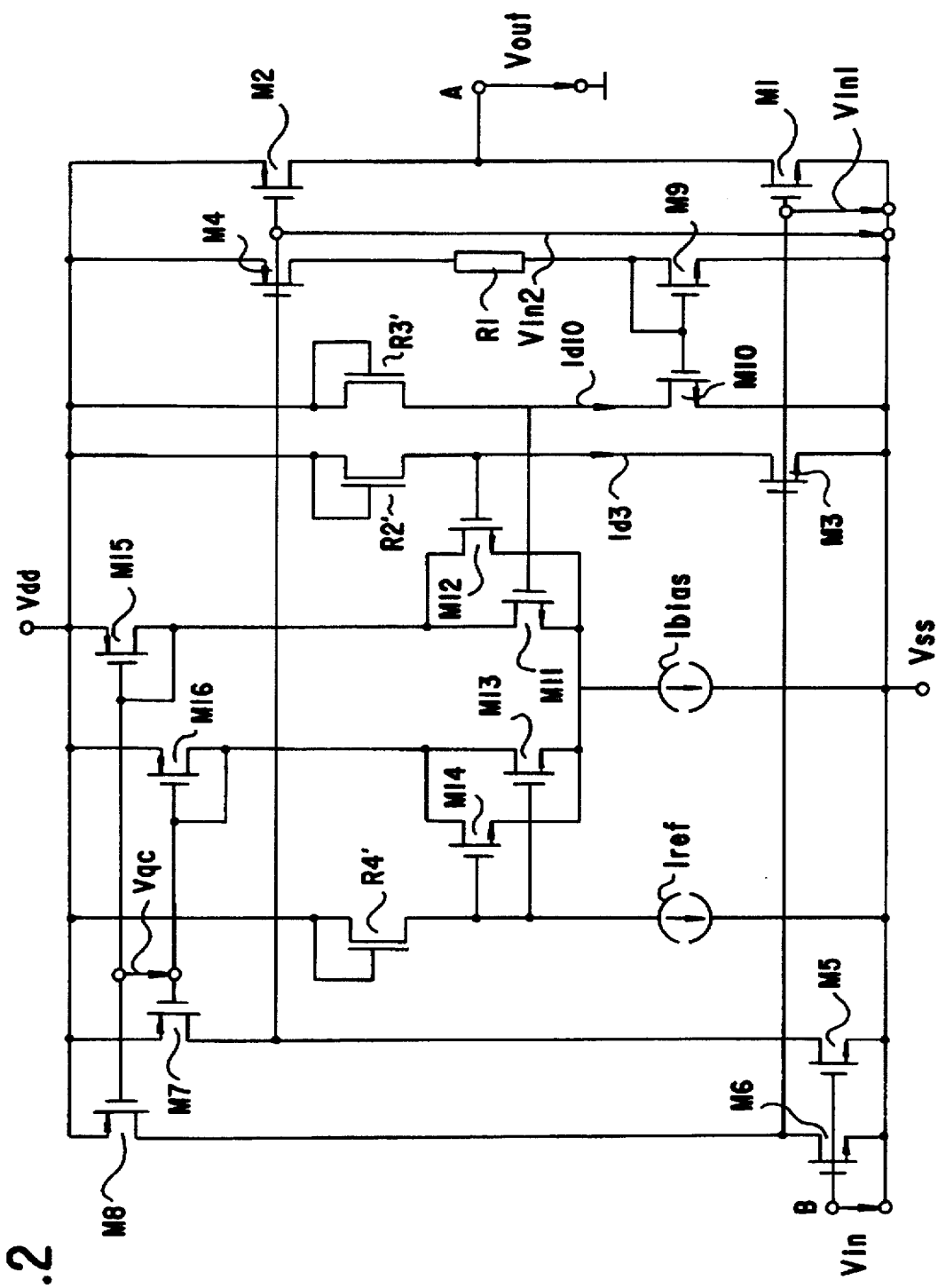
FIG. 2 is a view similar to FIG. 1 using MOS transistors instead of resistors.

As a result of the Miller capacitors between the drain-to-gate paths of the transistors M1, M2, the signal path is advantageously stabilized. Moreover, the transverse current regulation can be stabilized to the respective supply potentials Vss or Vdd through the use of capacitors between the gate terminals of the transistors M1 and M2. These capacitors may be omitted, if the output transistors M1, M2 are sufficiently large in area and the Miller capacitors are relatively large. Moreover, the input voltage Vin is derived from a differential input stage, that converts differential input signals into the single-pulse signal Vin, which is referred to ground potential Vss. In the practical embodiment, the resistors, such as R1, R2, R3, R4, may also be constructed as diode-coupled MOS transistors, in which the gate and drain terminals are connected to one another. This embodiment is simple to integrate, since only transistor components are used. This embodiment having MOS transistors R2',R3' and R4' is shown in FIG. 2.

I claim:

1. A current driver circuit with transverse current regulation, comprising:

supply voltage terminals;

at least two complementary output transistors having gate and source terminals and having main current paths, said main current paths being interconnected at a connecting node and being connected in series between said supply voltage terminals;

an output terminal connected to said connecting node;

current polling transistors each having a gate terminal connected to the gate terminal of a respective one of said output transistors and each having a source terminal connected to the source terminal of a respective one of said output transistors;

a differential amplifier having one branch controlled by signals derived from said current polling transistors and another branch controlled by a reference signal;

first and second current paths each having one input transistor with coupled gate terminals and each having a center pickup controlling a respective one of said output transistors; and current mirrors each coupling one of said branches of said differential amplifier into a respective one of said current paths.

2. The circuit configuration according to claim 1, wherein:

one of said branches of said differential amplifier has a first and a second transistor with main current paths connected in parallel and gate terminals each being controlled by one of the signals derived from said current polling transistors; and the other of said branches has a third and a fourth transistor with main current paths connected in parallel, source terminals coupled to the source terminals of said first and second transistors and gate terminals controlled by the reference signal.

3. The circuit configuration according to claim 2, including:

a first resistor connected in series with one of said current polling transistors;

a second resistor;

a current mirror having an output branch into which said second resistor is connected, and an input branch connected in series with the other of said current polling transistors;

the derived signal for controlling the one branch of said differential amplifier being picked up at said resistor.

4. The circuit configuration according to claim 3, including another current path being connected between said supply voltage terminals, said other current path having a series circuit of a resistor and a reference current source with a node coupling therebetween at which the reference signal is picked up.

5. The circuit configuration according to claim 4, wherein said resistors are diode-coupled MOS transistors.

6. The circuit configuration according to claim 2, wherein:

said current mirrors are first and second current mirrors;

said first current mirror has an output branch with a transistor connected in said first current path in series with said input transistor, and an input branch connected in series with said first and second transistors of said differential amplifier;

said second current mirror has an output branch with a transistor connected in said second current path in series with said input transistor, and an input branch connected in series with said third and fourth transistors of said differential amplifier; and said input transistor and said transistor of said output branch in said first current path have a coupling node therebetween connected to the gate of one of said output transistors, and said input transistor and said transistor of said output branch in said second current path have a coupling node therebetween connected to the gate of the other of said output transistors.

* * * * *